(12) United States Patent
Fischer

(10) Patent No.: US 6,389,047 B1
(45) Date of Patent: May 14, 2002

(54) WAVELENGTH-SELECTABLE LASER SYSTEM USING CAVITY RESONANCE FREQUENCY, ESPECIALLY USEFUL FOR FIBER OPTIC COMMUNICATION AND WAVELENGTH DIVISION MULTIPLEXING

(75) Inventor: Baruch Fischer, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 0 days.

(21) Appl. No.: 09/600,973

(22) PCT Filed: Jan. 27, 1999

(86) PCT No.: PCT/IL99/00051

§ 371 Date: Jul. 25, 2000

§ 102(e) Date: Jul. 25, 2000

(87) PCT Pub. No.: WO99/39411

PCT Pub. Date: Aug. 5, 1999

Related U.S. Application Data

(60) Provisional application No. 60/073,124, filed on Jan. 30, 1998.

(51) Int. Cl.$^7$ ................................................ H01S 3/13
(52) U.S. Cl. ........................ 372/32; 372/102; 372/18; 372/28
(58) Field of Search .......................... 372/18, 29, 32, 372/26, 28, 102, 6

(56) References Cited

U.S. PATENT DOCUMENTS 5,878,071 A * 3/1999 Delavaux ...................... 372/18
6,148,011 A * 11/2000 Larose et al. .................. 372/6

* cited by examiner

*Primary Examiner*—Leon Scott, Jr.
(74) *Attorney, Agent, or Firm*—Edward Langer, Pat. Atty.

(57) ABSTRACT

A wavelength-selectable laser system (10) is achieved by addressing the suitable mode-locked frequency of a multi-length laser cavity formed by multiple wavelength-selective mirrors (20) such as fiber gratings. This is useful for fiber optic communication and WDM (wavelength division multiplexing) networks where there is incorporated an information encoder/modulator (22) of the light in the sending side and a detector in the receiving side, which are matched to the laser system.

16 Claims, 12 Drawing Sheets

WAVELENGTH-SELECTABLE LASER SYSTEM USING CAVITY RESONANCE FREQUENCY, ESPECIALLY USEFUL FOR FIBER OPTIC COMMUNICATION AND WAVELENGTH DIVISION MULTIPLEXING

This application claim benefit to provisional No. 60/073,124 filed Jan. 30, 1998.

FIELD OF THE INVENTION

The present invention relates to fiber optic communication systems and devices, and other optical systems, and more particularly, to wavelength division multiplexing (WDM) for fiber optic communication, and to a system which enables the introduction of many wavelengths in fiber optic communication systems, by use of a tunable source which enables switching from wavelength to wavelength to be able to choose different channels in communication networks.

BACKGROUND OF THE INVENTION

Fiber-optic communications is a most important method of communications. A large amount of communication is transferred via fiber optics systems. Examples of such communications beyond telephones are Internet and cable TV networks. The present commercial transmission rate of a single fiber with a single wavelength can reach as high as 2.5 Gb/sec or 10 Gb/second. A way to expand the transmission capacity is by the use of more than one wavelength on a single fiber. This technology is called WDM.

The state of the art systems allow more than 32 channels per fiber, and this capacity is expected to increase. Most of today's communication systems are known as passive systems, meaning that the particular wavelengths are assigned to particular addresses and there is a limited ability to change these dynamically during the communication. Dynamically tunable light sources and systems exist, however today they are limited.

Presently, solutions for such needs are mainly based on semiconductor laser arrays and waveguide grating technology, as described in the paper by U. Koren, Optical Fiber Communication Conference, Vol. 2 of 1998 OSA Technical Digest Series (Optical Society of America, Washington D.C. 1998) p.376, the paper by M. Zirngibl, C. H. Joyner, L. W. Stulz, U. Koren, M. D. Chien, M. G. Young and B. I. Miller, IEEE Photon. Technol. Lett, Vol.6, p.516, (1994) and the paper to M. Zirngibl, C. H. Joyner and L. W. Stulz, Electron Lett., Vol. 30, p.1484, (1994). The devices described are subject to bottlenecks in their switching capabilities, and in their multiwavelength dynamic and routing capabilities.

A direct use of fiber components and fiber lasers for such purposes, is more complicated, since straight modulation and high speed control of the gain medium are neither a simple nor a practical option. Then, a simple controllable multi-wavelength operation can be mainly based on tunable filters, such as temperature or strain dependent fiber gratings, which can be switched only at a relatively slow speed. The switching time scale of current systems reaches only the millsecond range.

Therefore, it would be desirable to provide a system and method for high speed wavelength selection in a single laser source to enable its use in dynamic wavelength division multiplexing communication methods and other systems.

SUMMARY OF THE INVENTION

Accordingly, it is a principal object of the present invention to overcome the limitations of prior art wavelength switching systems and provide a system that enables multi-wavelength selection in laser sources, enabling their use in the communication network in a special way. The most common laser for communications is the indium phosphide semiconductor laser and there are several versions of this device. Also used are erbium-doped fiber lasers based on fiber optic technology. The desire is to take the lasers and operate them at multiple wavelengths, and to be able to select and switch from the multiple wavelengths available.

According to a preferred embodiment of the present invention, there is provided a wavelength-selectable laser system comprising:

a complex laser cavity defined by a reflective mirror at one end and at the other end, a series of spaced apart wavelength-selective reflective mirrors each defining a respective predetermined cavity length;

a laser gain element; and an active modulation element in said complex laser cavity operable to selectively provide mode-locking of a specific cavity length among said defined predetermined cavity lengths.

The goal of the present invention is to operate a laser at particularly chosen wavelengths with the ability to switch from wavelength to wavelength since the laser can operate at more than one wavelength. The method is based on cavity-resonance-operated wavelength selection (CROWS). It is operated by applying the suitable mode-locking frequency of a multiple-length fiber or diode laser cavity, formed for example, by successive multiple fiber grating reflectors, each with a different Bragg wavelength. It allows selection and high speed switching between these wavelengths. This can be useful for dynamic wavelength division multiplexing (WDM) in fiber optic communication systems having multiple wavelength channels in a single fiber, each channel carrying information which can be routed and processed independently.

Usually a laser cavity is constructed using two end mirrors. One can be a broadband mirror at a first end. In the present invention, at the second end there are located a plurality of selective mirrors one after the other in different locations and these define different lengths of the cavity. A parallel geometry for gratings is also possible, but it introduces losses due to splitters which might be needed. As a result, every cavity length has a different mode-locking frequency. Different cavity lengths in turn define different wavelengths of the laser operation.

To select the wavelength of operation of the laser, there is chosen a mode-locked frequency that is associated with the length of this cavity. If a specific wavelength is desired in the laser, the mode-locked frequency is chosen and this implies a choice of the selective mirror which is associated with that wavelength. Switching to a different wavelength is simply achieved by applying a different mode-locked frequency which is matched to the cavity length that forms this selective mirror or grating. This grating provides the new wavelength which is chosen.

The present invention features high speed wavelength tuning reaching the nanosecond switching time range. The system also features compactness, simple construction and low cost, and employs reliable fiber optic technology which is easily integrated and connected to fiber optic systems. The system is scalable to a large number of wavelengths.

Other features and advantages of the invention will become apparent from the following drawings and the description.

BRIEF DESCRIPTION OF THE DRAWINGS

For a better understanding of the invention with regard to the embodiments thereof, reference is made to the accompanying drawings, in which like numerals designate corresponding elements or sections throughout, and in which.

DETAILED DESCRIPTION OF THE PREFERRED EMBODIMENTS

Figure 1:
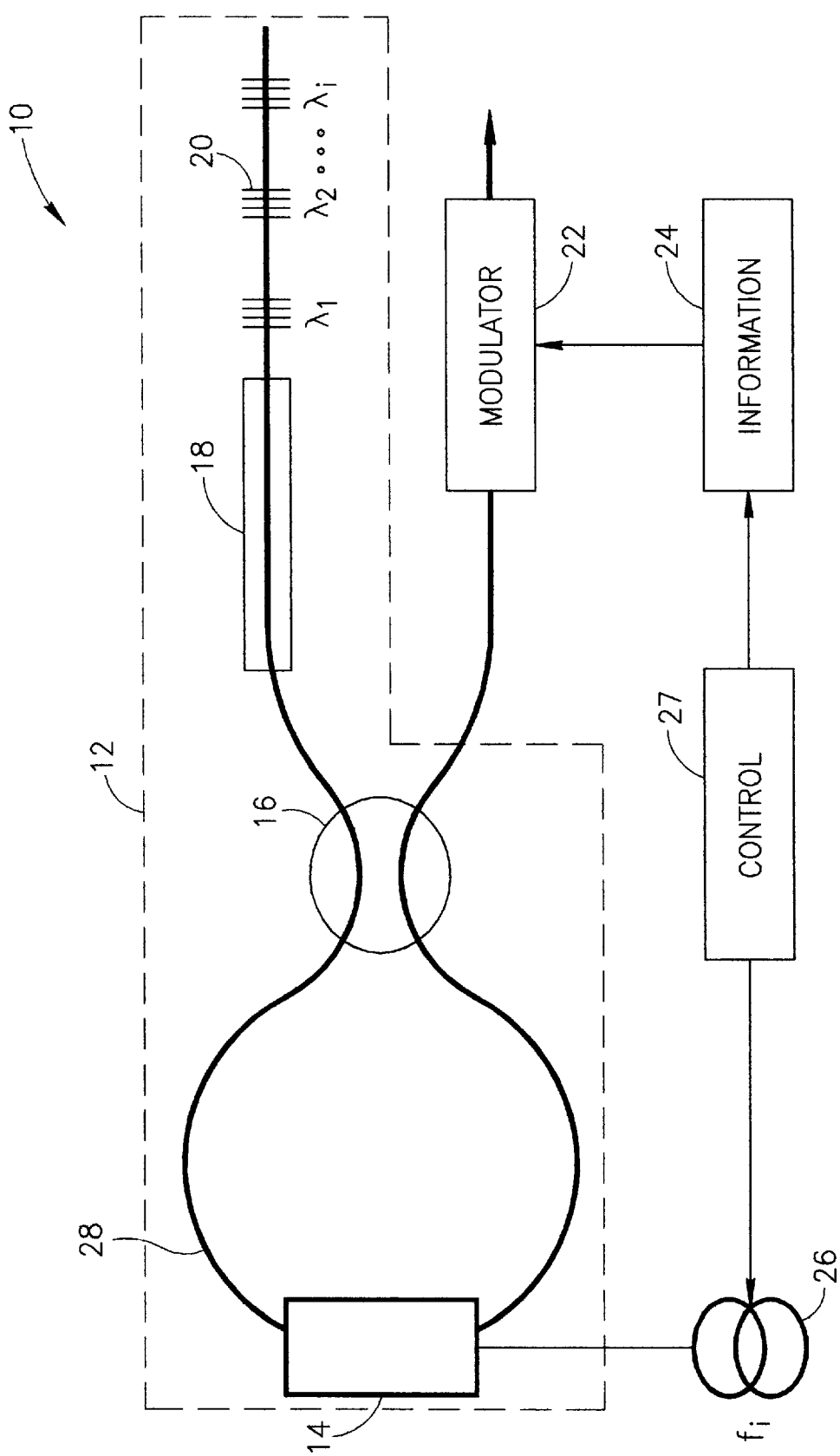
FIG. 1 is a schematic presentation of a preferred embodiment of a fiber laser version of a Cavity Resonance-Operated Wavelength Selection system (CROWS), constructed and operated in accordance with the principles of the present invention.

Referring now to FIG. 1, there is shown is a schematic presentation of a preferred embodiment of a fiber laser version of a Cavity Resonance-Operated Wavelength Selection system (CROWS) 10. The system 10 comprises a laser cavity 12 in which there is a mode-locking modulator 14 provided by a crystal such as the LiNbO3 type, a fiber coupler 16, an erbium-doped fiber amplifier 18, and a series of spaced apart fiber Bragg grating reflectors 20, which form the selective mirrors. External to the cavity is an information input modulator 22, also using the LiNbO3 type, or equivalent, which is fed by input data information 24. The RF generator 26 provides the mode-locking frequency. A control unit 27 provides the matching between the mode-locking modulator and the information input modulator 22 in some modes of operation. The information encoding can be done with the information input modulator 22, which has a bit rate which is controlled and matched and/or synchronized with the laser mode-locking modulator 14.

In the schematic description of the CROWS system shown in FIG. 1, at one end of the cavity 12, there is located a broadband mirror. In the experiment conducted by the inventor, the broadband mirror is a fiber loop mirror 28 which contains a LiNbO3 light intensity mode-locking modulator that provides the active mode-locking. A Faraday isolator element can also be inserted into the loop to make the oscillation unidirectional (in the loop) and independent on the modulator location. However, other configurations, including a linear cavity can be used. The other end of the cavity consists of several wavelength-selective narrowband mirrors. These are successive fiber gratings 20, each having a different Bragg wavelength, one after another in different locations, and thus defining different cavity lengths. Each cavity length has a unique mode-locking frequency, which, in turn is associated with each of the different wavelengths. The Bragg wavelengths are chosen to provide the needed lines (wavelengths) for the laser operation. The fiber had fabricated in it a set of successive selective mirrors of fiber optic gratings 20 which was formed by ultraviolet illumination by a known technique such as that disclosed in the paper by K. O. Hill, B. Malo, F. Bilodeau and D. C. Johnson, Annual Review in Material Science, Vol.23, p.376, 1993.

In this particular experiment using the fiber laser only two gratings were made, but in principle many such gratings can be constructed in the same fiber in different locations. Each of the gratings had a different Bragg wavelength, meaning it has high reflectivity for a particular wavelength and no or low reflectivity, or high transparency, for other wavelengths. The mode-locking of the laser can be defined by each cavity length which is associated with a respective one of the selective mirrors of a fiber optic grating with a well-defined Bragg wavelength. The mode-locking operation is achieved by applying the suitable modulation frequency to the semiconductor amplifier 18, resulting in the specific laser output wavelength.

The cavity lengths used in the experiment conducted were of a few meters, having a basic cavity resonance frequency around 10–20 MHz. For pulse rates in the Ghz range, used for fiber optic communication, much shorter cavities are needed. Alternatively, high order cavity resonance frequencies were used although this affects the performen of the laser. The two fiber grating mirrors had Bragg wavelengths of $\lambda_1$=1537.5 nm and $\lambda_2$=1538.6 nm. The gratings were made by ultraviolet illumination of Hydrogen-loaded standard fibers, through a phase mask in the usual technique, as described above in connection with the K. Hill et al. reference. The basic cavity resonances, or mode-locking frequencies, for these two mirrors, were f1=17.597 MHz and f2=14.963 MHz, corresponding to roundtrip laser cavity lengths of 11.4 m and 13.4 m, respectively. In the mode-locking demonstration shown here higher order cavity resonances were used, 30-st order for f1 and 35-th order for f2, giving frequencies of 527.9 Mhz and 523.75 Mhz, for the two gratings $\lambda_1$ and $\lambda_2$ respectively.

Figure 2:
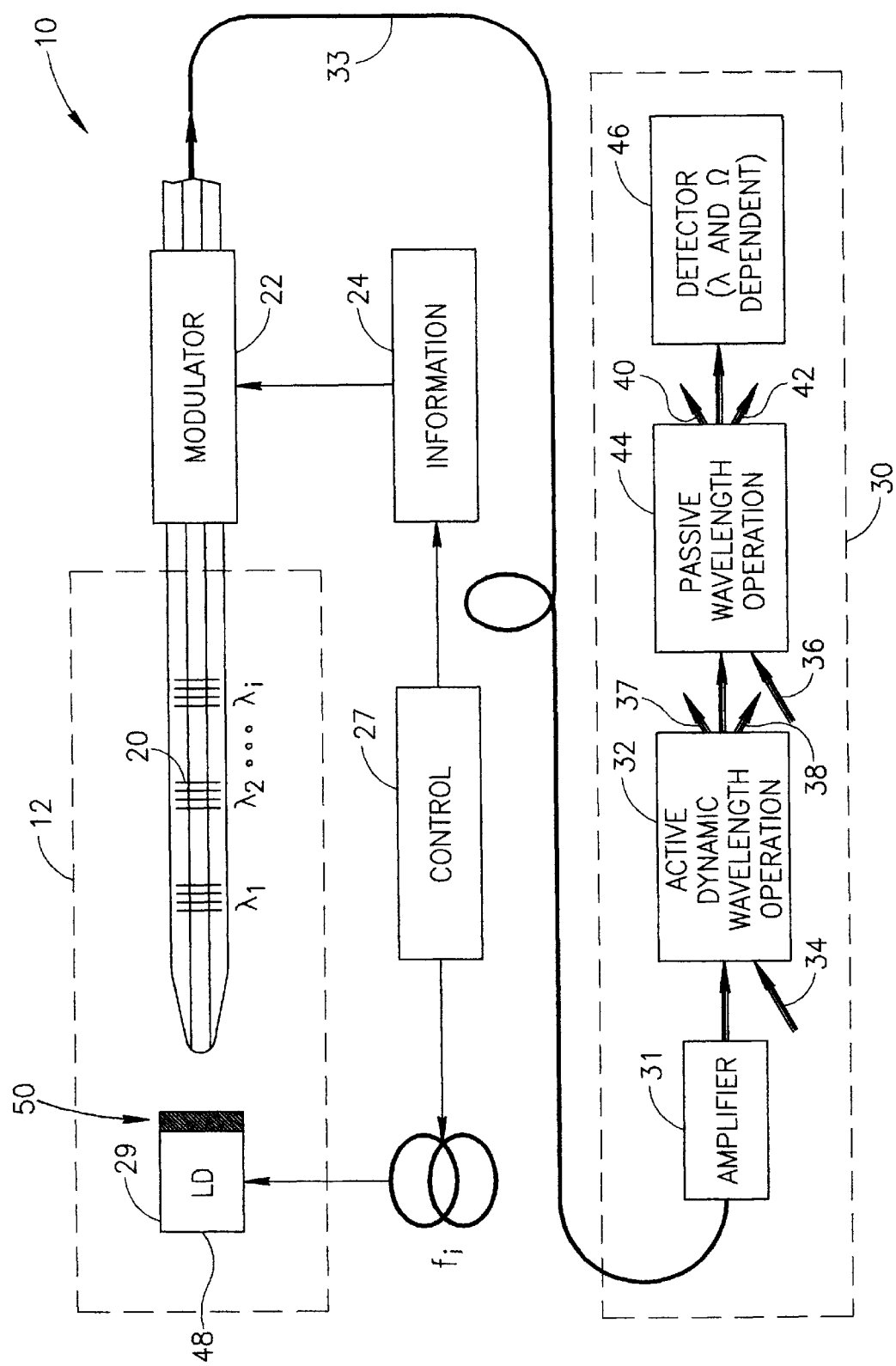
FIG. 2 is a schematic presentation of another version of a CROWS system.
Figure 3A:
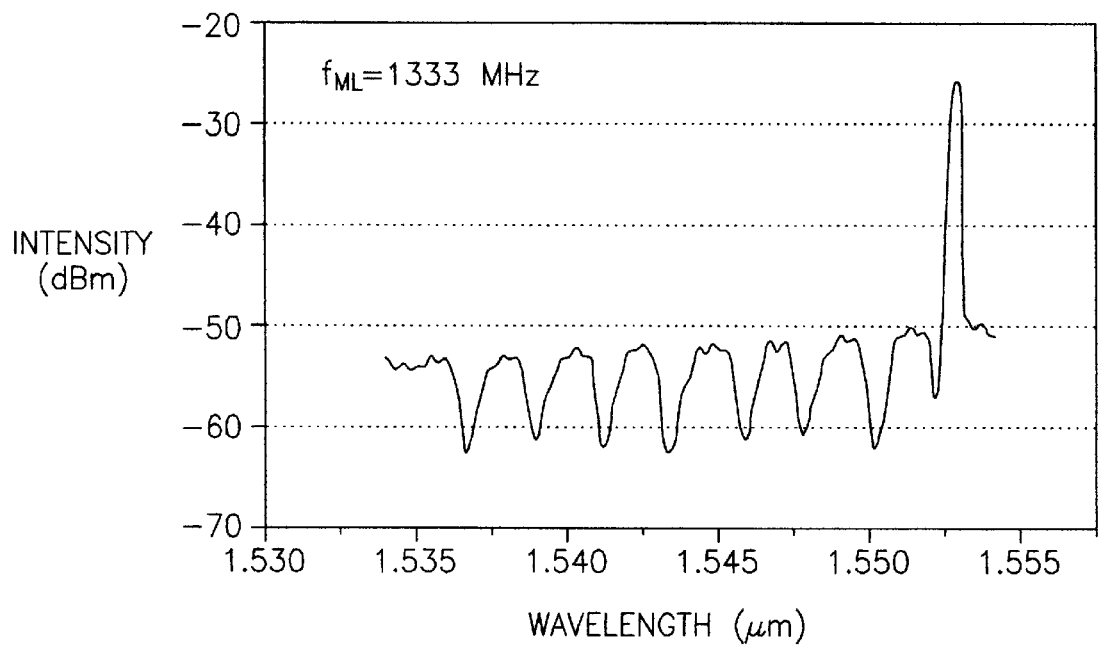
FIGS. 3a–h are examples of experimental results for a CROWS system using a diode laser in the configuration of FIG. 2, with each waveform showing a particular activated wavelength.
Figure 3B:
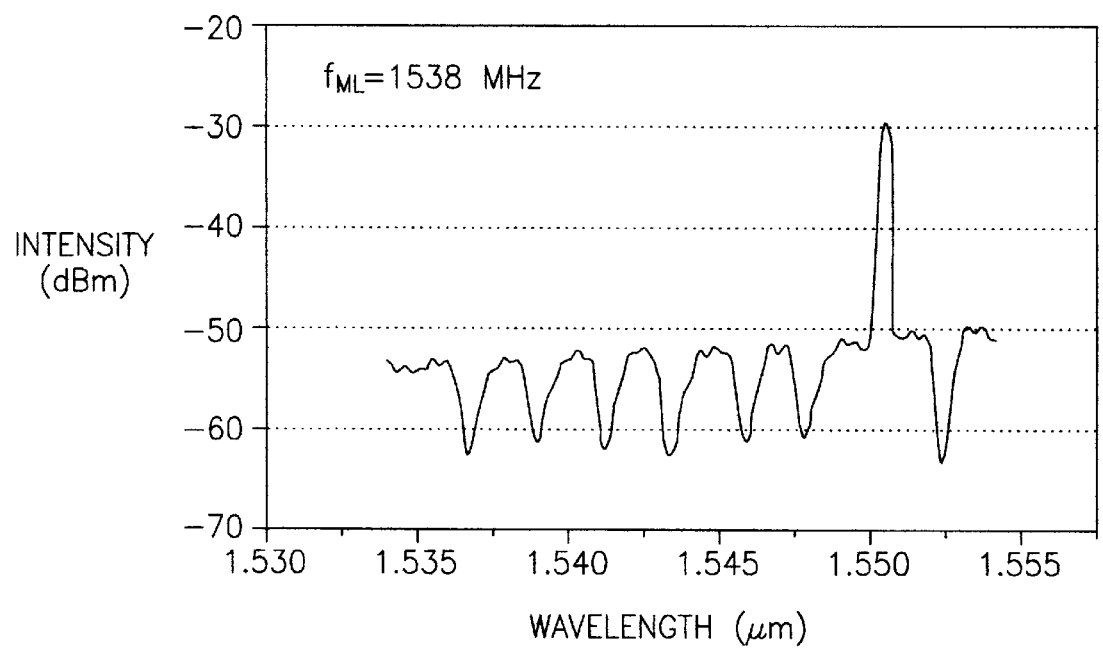
Figure 3C:
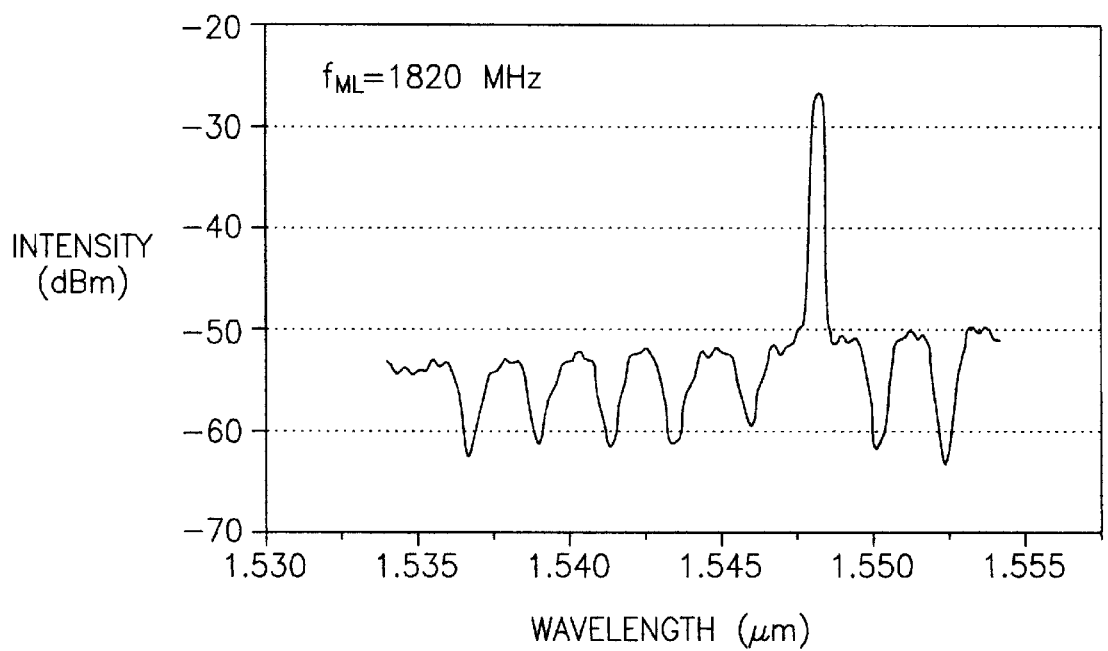
Figure 3D:
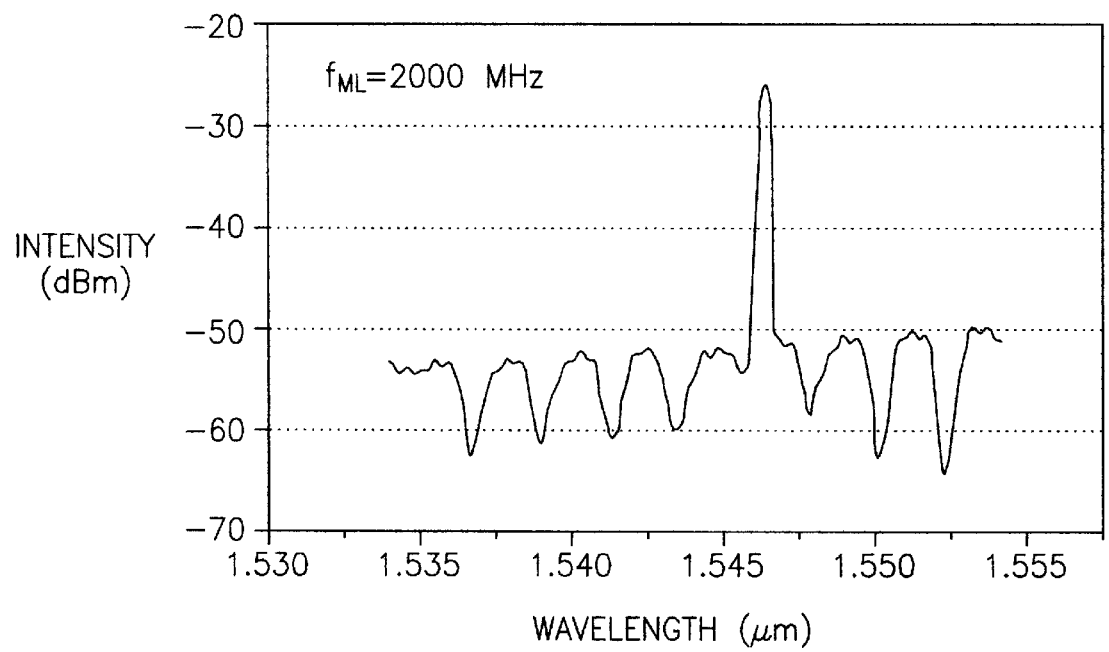
Figure 3E:
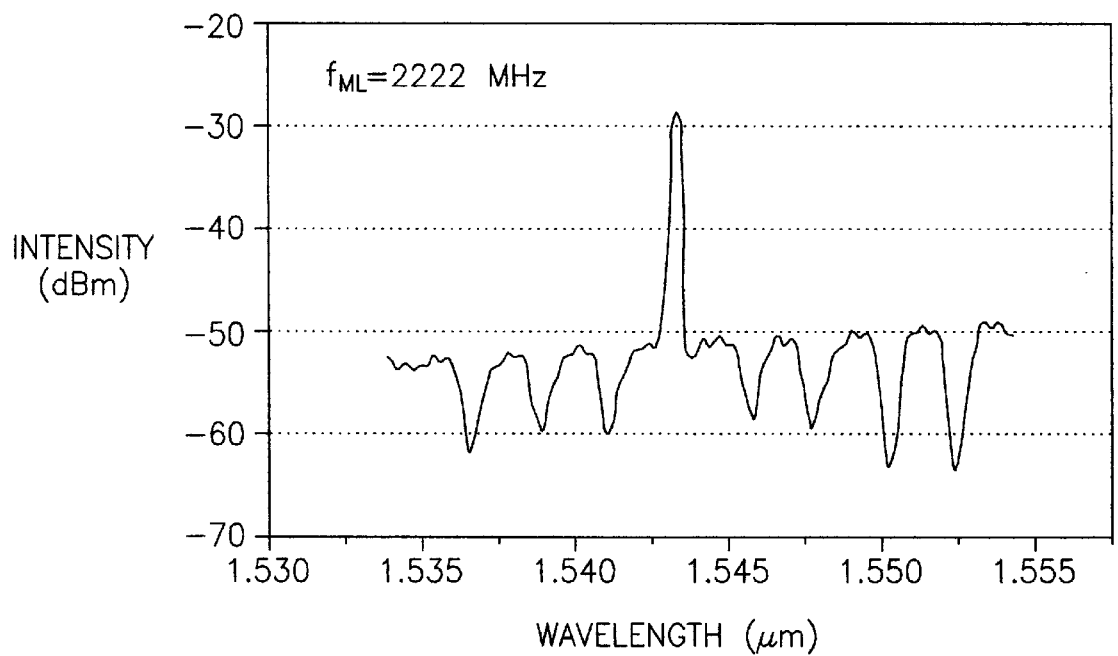
Figure 3F:
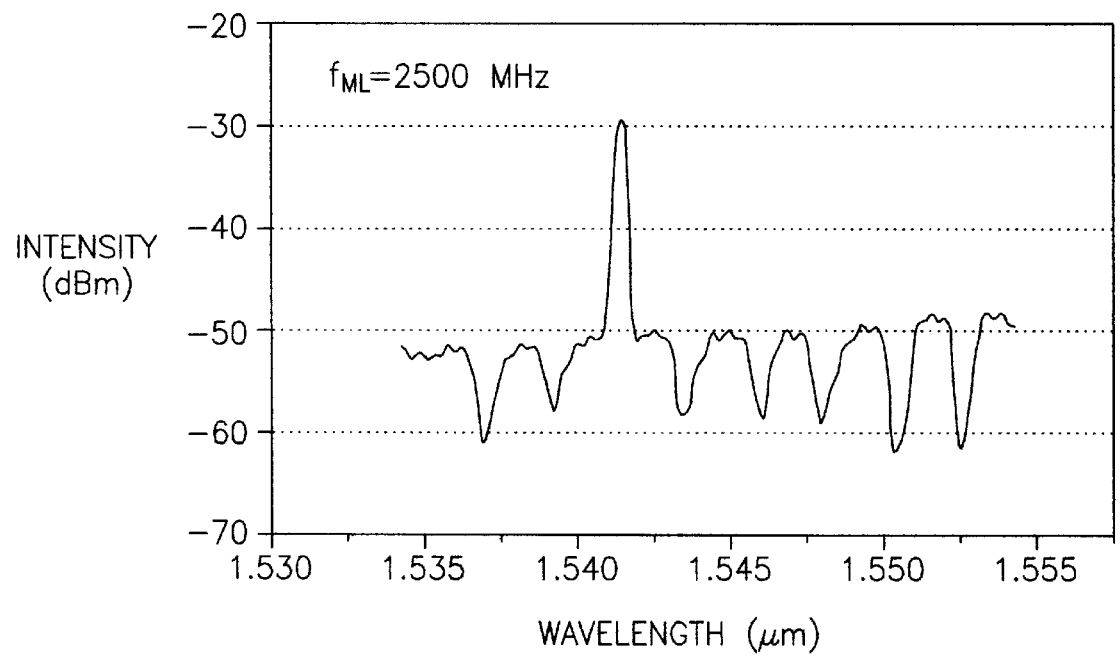
Figure 3G:
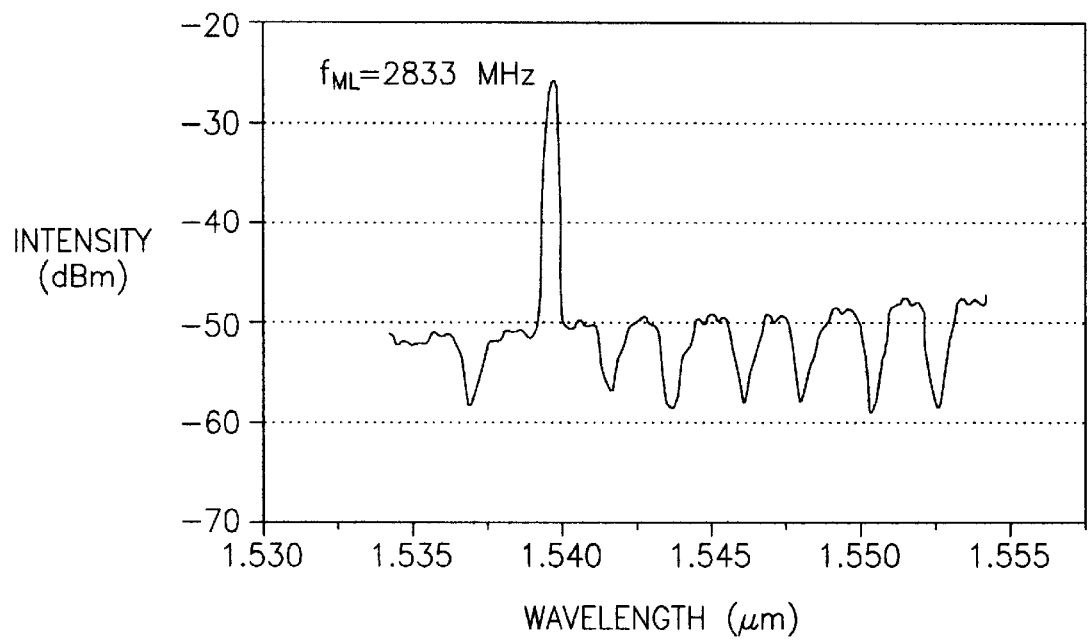
Figure 3H:
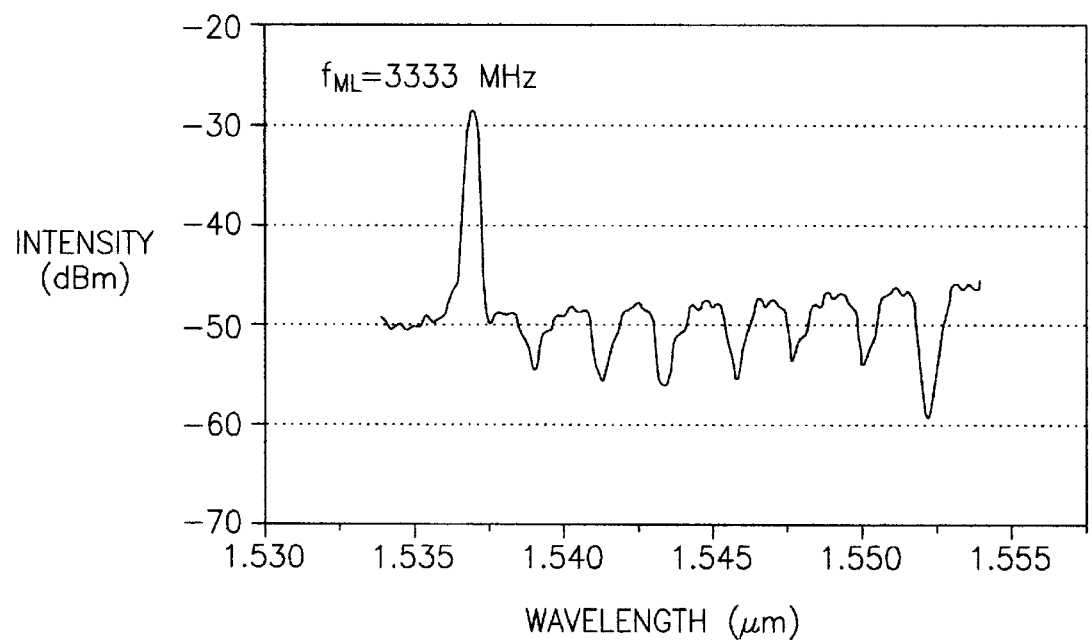
Figure 4A:
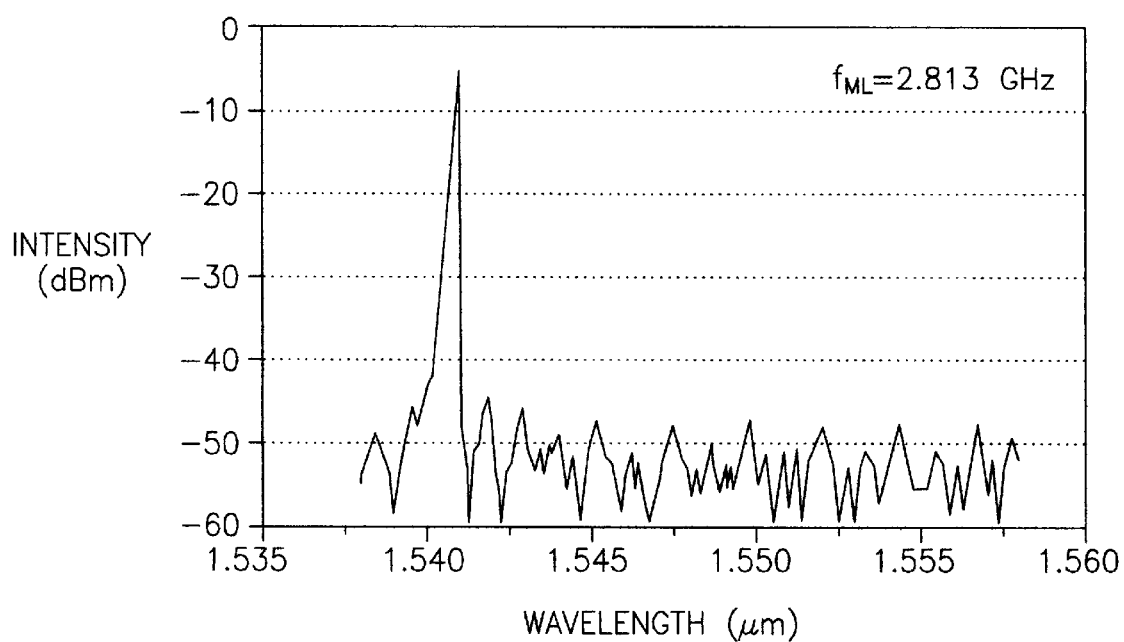
FIGS. 4a–h are examples of experimental results for another CROWS system using a diode laser in the configuration of FIG. 2.
Figure 4B:
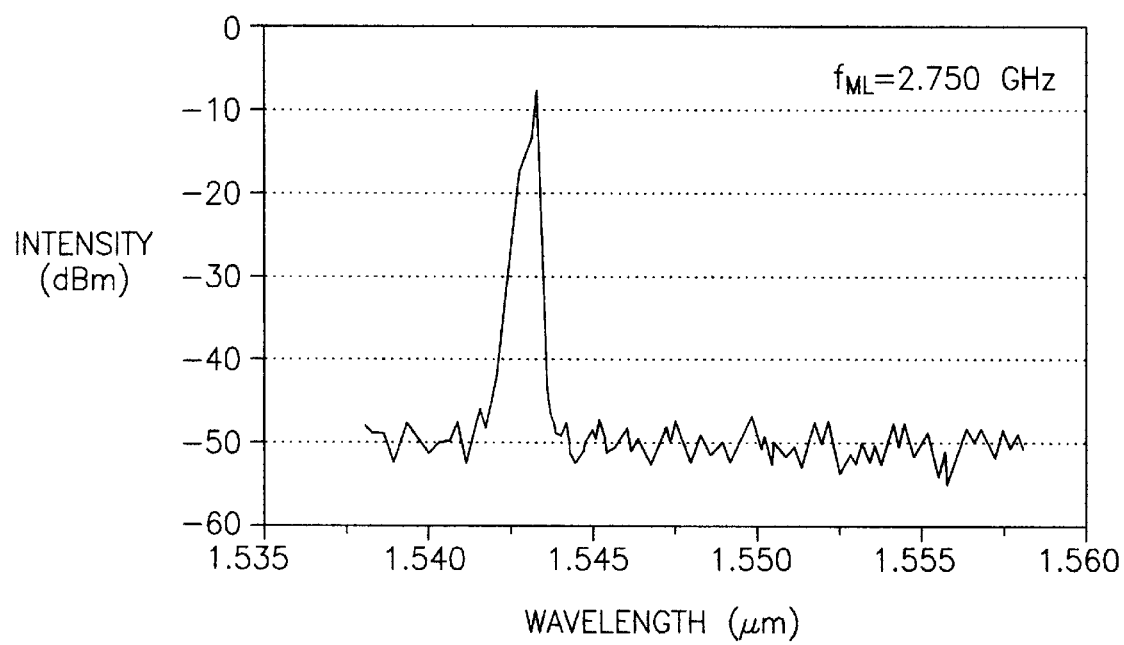
Figure 4C:
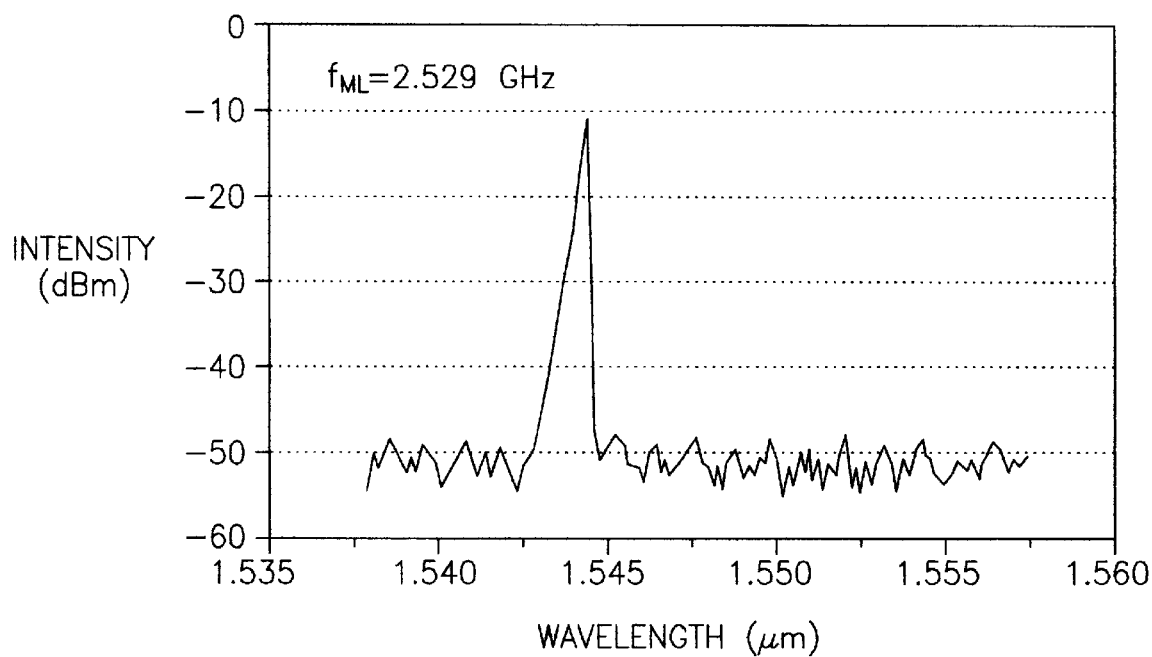
Figure 4D:
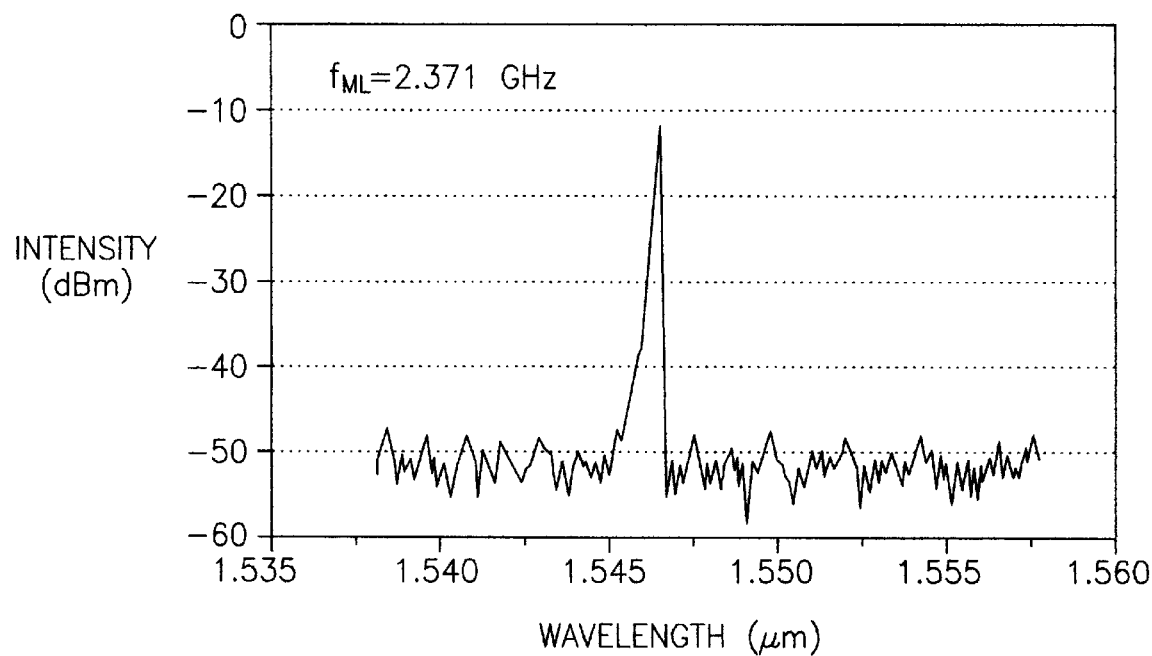
Figure 4E:
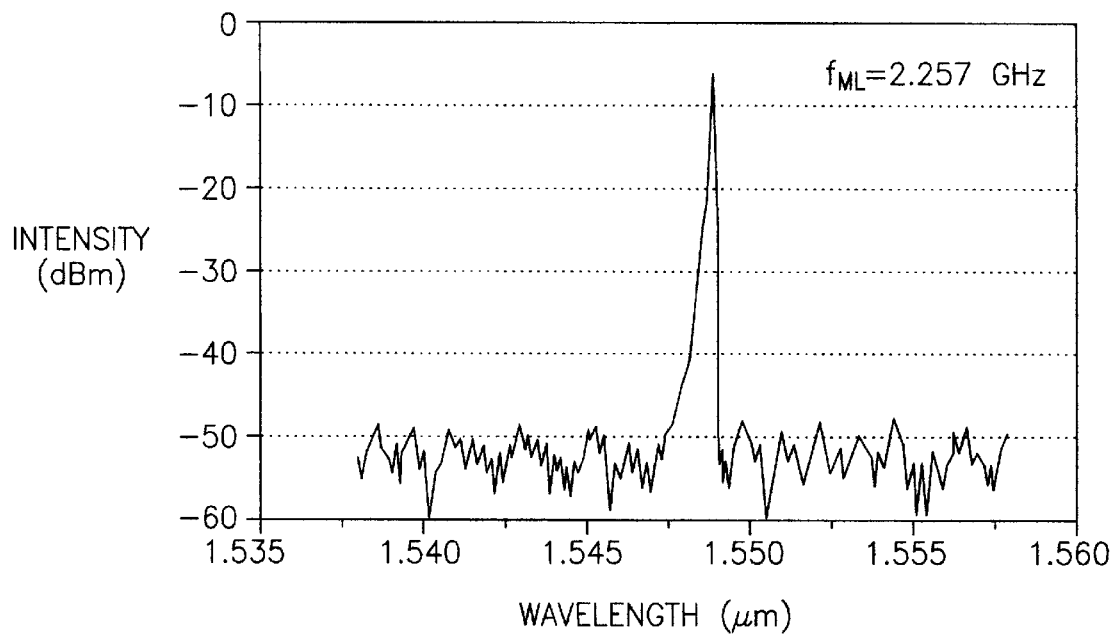
Figure 4F:
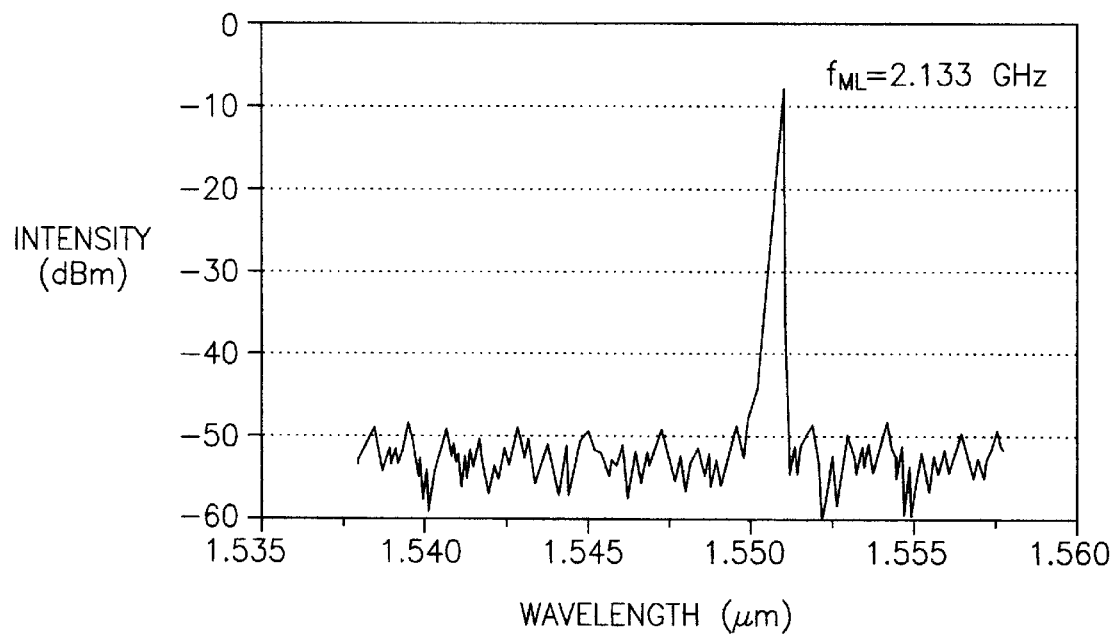
Figure 4G:
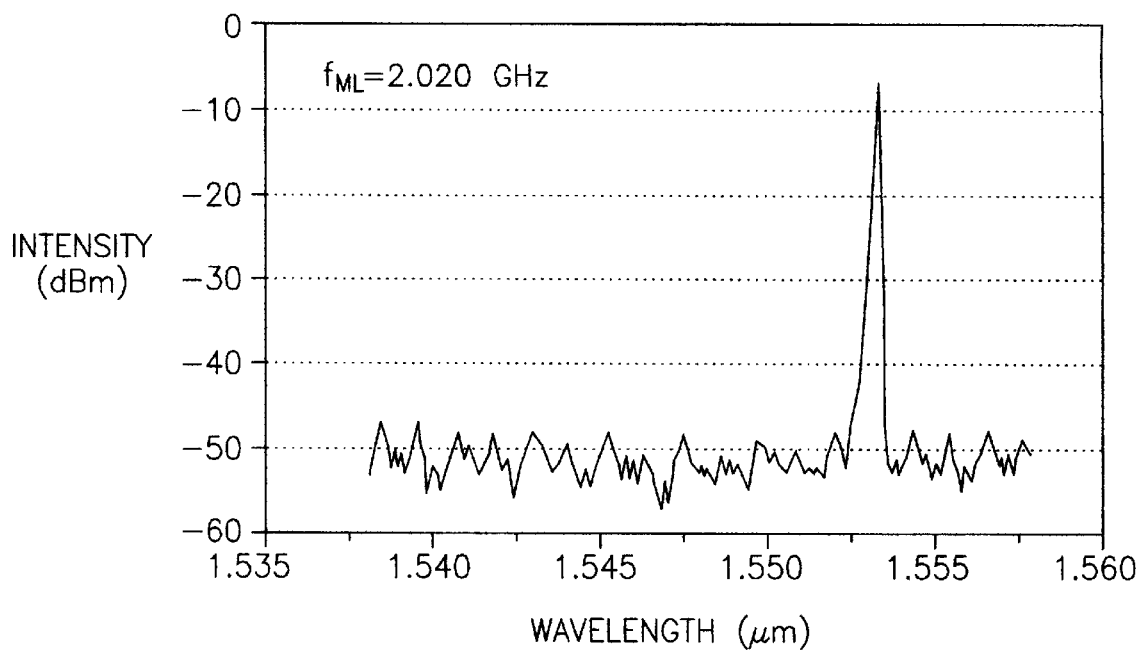
Figure 4H:
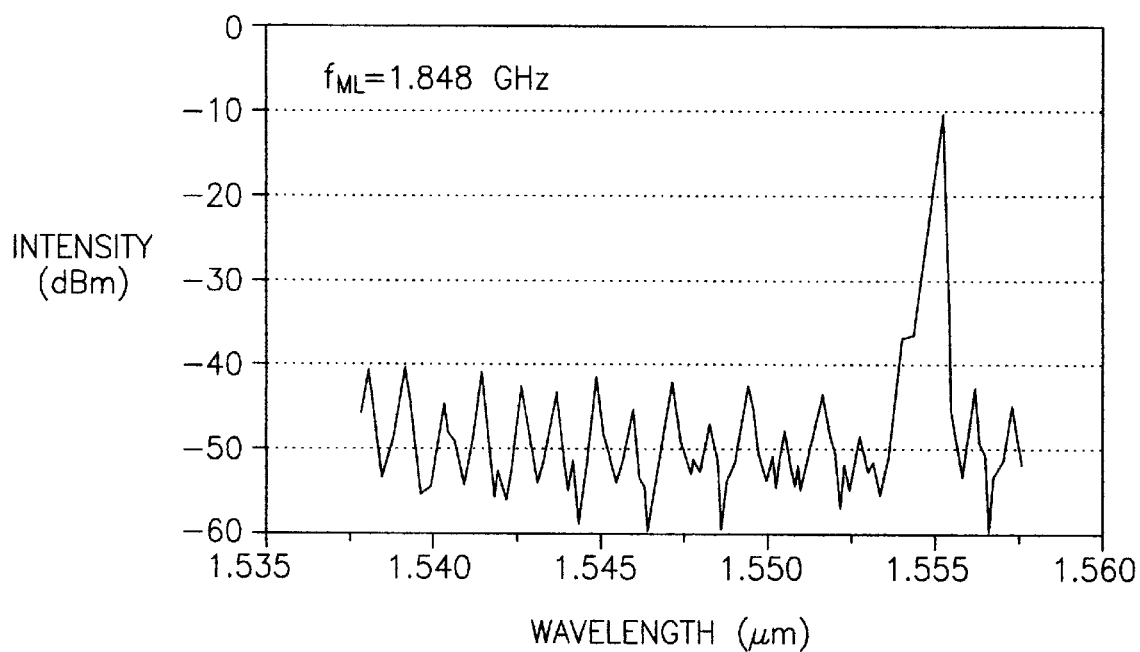

In FIG. 2 there is shown a similar layout of the fiber optic wavelength-selectable system 10 to that of FIG. 1, using a diode laser 29 for the gain element instead of a fiber laser. The layout shows the wavelength-selectable laser source in a possible downstream fiber network 30, comprising an amplifier 31 for relaying the signals at an increased strength over a long distance, which feeds to an active dynamic wavelength operation 32. The light with the selected wavelengths in the fiber 33 can be amplified by one or more erbium-doped amplifiers, pass through isolators, add (possibly from other tunable sources) and drop channels and wavelengths, multiplexing and demultiplexing sections, and routed, actively or passively, to various destinations and detectors. Several nodes 34, 36 are shown which can receive other inputs from different systems or provide output 37, 38, 40, 42 to other parts of the fiber optic network, and provide routing and switching of the channels and information, and this feeds to a passive wavelength operation 44, which provides a de-multiplexing function. This leads to a set of detectors 46 which decode the information and relay it for use.

The diode laser system of FIG. 2 features a wavelength selectable diode laser source with eight channels, based on cavity resonance operated laser wavelength selection (CROWS). In the layout shown, the source is an extended cavity diode laser 29, coupled to fiber gratings 20. The laser can operate at several chosen wavelengths, eight in the layout shown, and it is possible to rapidly switch its operation from one wavelength to another.

The mode-locking is obtained by actively modulating the current injection and thus the gain of the laser diode 29, at the resonant frequency of the cavity 12, or at a multiple of it. In accordance with the inventive technique, at one end of the cavity 12, there are located successive fiber gratings 20 having different Bragg wavelengths, one after another, and these define different lengths of the cavity. The other end of the laser diode can be a broadband mirror 48. As a result, every cavity length has a different mode-locking frequency. Different cavity lengths in turn define different wavelengths of the laser operation.

To select the wavelength of operation of the laser, there is applied the mode-locking frequency which is associated with the length of this cavity, and this implies a choice of the associated wavelength. Switching to a different wavelength is simply achieved by applying a different mode-locked frequency which is matched to the cavity formed by the fiber grating with this wavelength.

In the layout shown using a diode laser as shown in FIG. 2, one of the mirrors of the laser was eliminated by anti-reflective (AR) coating 50, which allowed extension of the diode laser cavity to the fiber coupled to it, containing the wavelength selective mirrors comprising gratings with Bragg wavelengths $\lambda_1$. The laser is electrically driven using DC with a modulation having a frequency fi=$\Omega/2\pi$, that provides the mode-locking for the specific cavity length with the associated grating and wavelength $\lambda_1$. As with the layout of FIG. 1, the information input encodes the light output via a matched modulator.

The fiber had fabricated in it eight successive fiber gratings with different Bragg reflectivities, about 2 nm apart, as can be seen by the data of FIGS. 3 and 4. These gratings were made by ultraviolet illumination of Hydrogen-loaded standard fibers, through a phase mask according to the usual technique described earlier in connection with the paper by K. Hill et al. The mode-locking operation is achieved by applying the suitable RF modulation added to the DC bias on the semiconductor amplifier.

The cavity lengths used in the layout of FIG. 2 were of a few centimeters to tens of centimeters, to obtain a first order or a higher order mode-locking pulse train with a repetition rate in the order of a few Ghz or higher. In the first experimentally studied laser, data for which is shown in FIG. 3, the second order resonance was used for the two extreme gratings which form the longer cavities. For the remaining six gratings, the first order resonances were used. In the second laser system studied, data for which is shown in FIG. 4, for all gratings the second order resonances were used. In general higher order resonances can be used for a further increase of the pulse rate.

In FIGS. 3 and 4, there are shown the two examples of the experimental results for cavity resonance-operated wavelength-selective switching (CROWS) each using a diode laser, in the configuration of FIG. 2. The eight spectra show the different single wavelength operation selected by the matched applied modulation frequency. The various values for $\lambda_1$, (the Bragg wavelength of the grating which forms the specific cavity) are indicated in the figure, while the resonance frequencies are also indicated in the figure.

Figure 5:
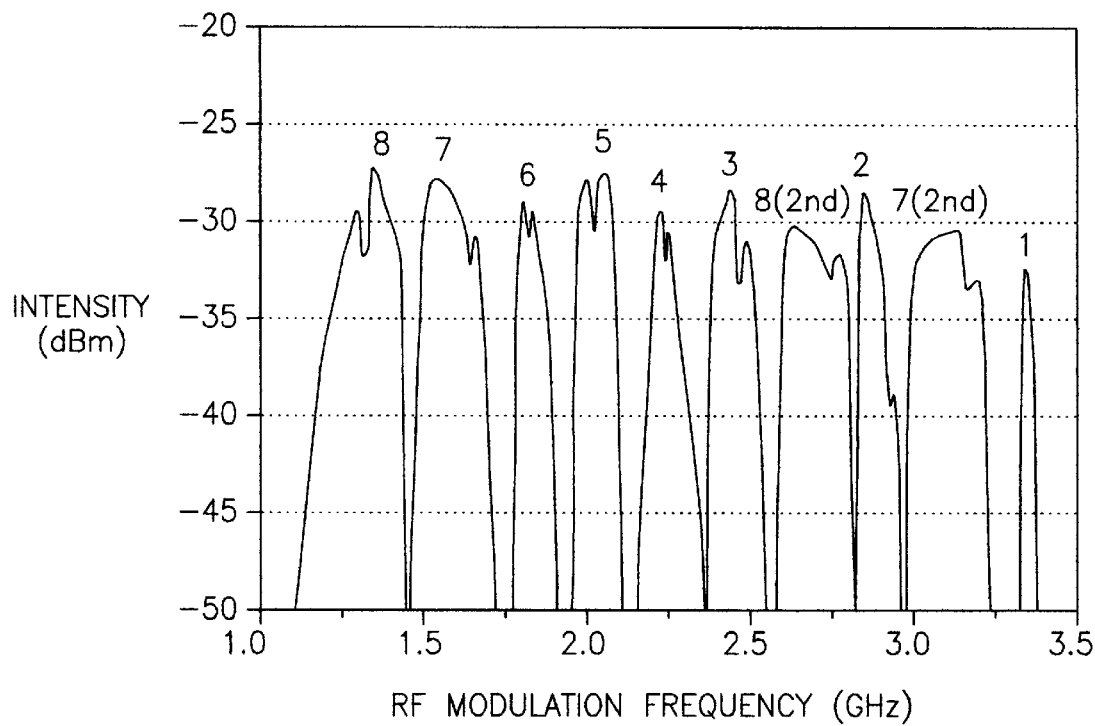
FIG. 5 shows data from the experiment of FIG. 2 for the diode laser, relating to the results of FIGS. 3a–h, showing the intensity of the output light pulse train as the applied frequency for mode-locking is varied.

FIG. 5 shows data from the first diode laser, related to the data of FIG. 3, showing the intensity of the output light pulse train as the applied frequency for mode-locking locking is varied. It gives the RF frequency width around the resonances, which operates the various mode-locking options with their activated wavelengths.

Figure 6:
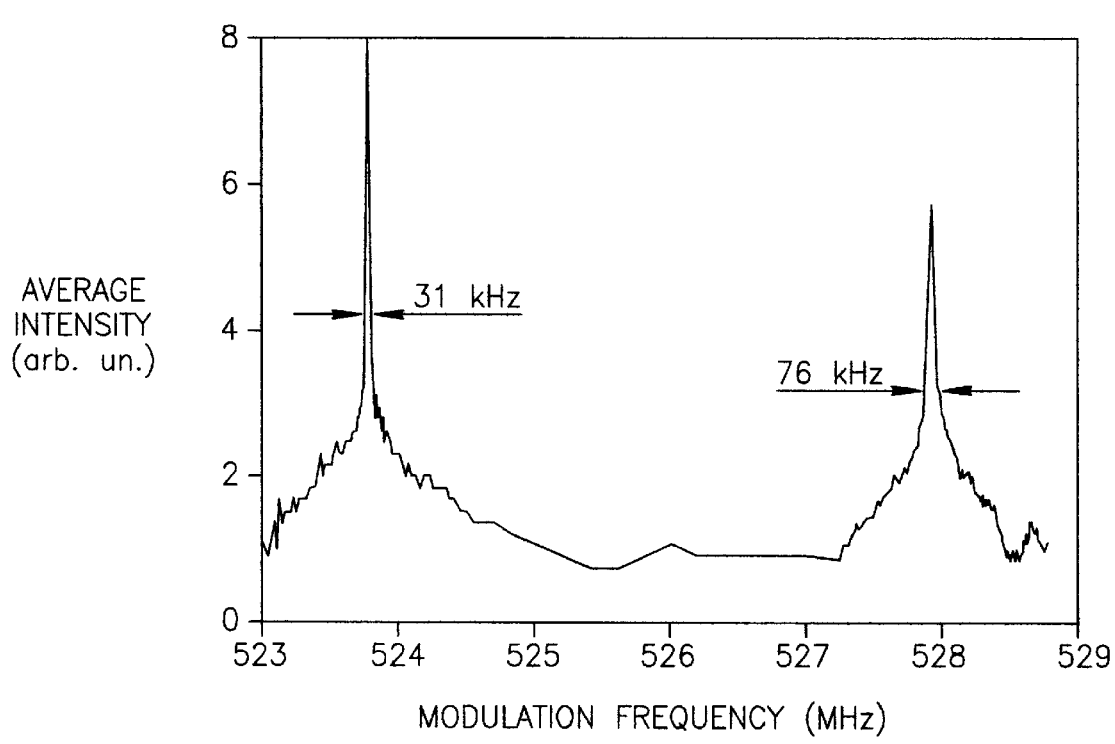
FIG. 6 shows data from the experiment of FIG. 1 for the fiber laser having two wavelengths.

FIG. 6 is similar to FIG. 5 for the fiber laser.

The typical mode-locked pulse width was around 30 ps, but much lower width can be obtained by mode-locking.

Figure 7:
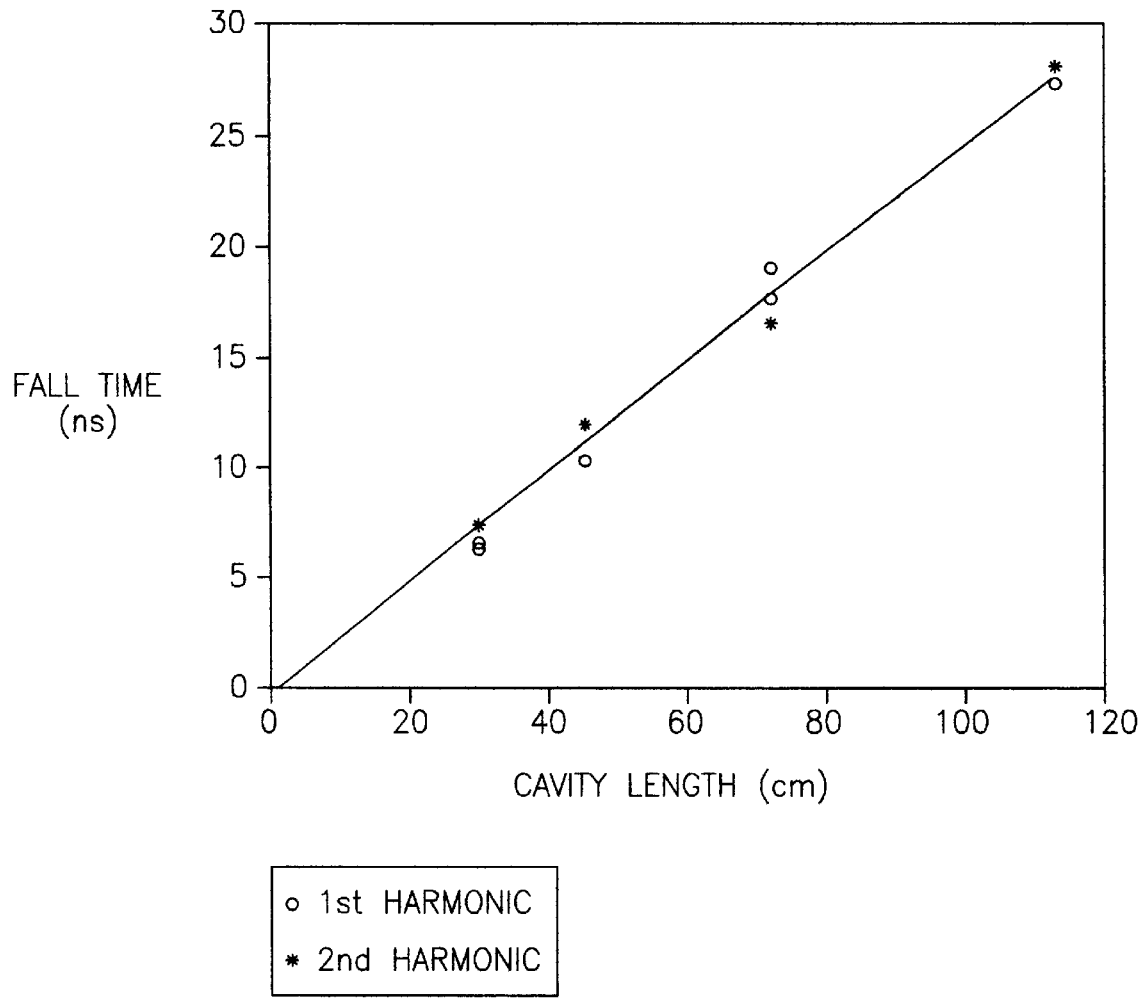
FIG. 7 shows a graph of experimental results for the switching time between wavelengths for the laser diode system (CROWS), as a function of the cavity length.

The switching time between wavelengths can be short, and depends on the responses of the laser, mainly dictated by the photon lifetime in the cavity, and on the RF drive. With a careful fabrication of a compact laser cavity, a switching time in the nanosecond range (FIG. 7) can be obtained. Then, dynamic operations with wavelength changes in the package switching level can be achieved. However, much lower rates can be sufficient for dynamic WDM uses.

A use of the laser source for communication purposes needs further consideration. The mode-locking operation provides a train of short pulses of light, at a repetition rate which is the resonance frequency. In order to input information on this stream of pulses, the output can be modulated by an external modulator. However, since for every wavelength there is an associated different mode-locking frequency, the repetition rate of the pulses is different. This means that the external modulator 22 has to be matched to the repetition rate of the pulses which is different for each wavelength, according to the mode-locking frequency chosen. Therefore, there must be frequency coordination between the mode-locking frequency and the information inputting performed by the external modulator 22, according to the wavelength chosen.

However, when the mode-locking frequency is much higher than the information bit rate, the laser source can be regarded as quasi-continuous, and the control between the information modulation and the mode-locking rates can be relaxed.

There is a possibility of achieving higher mode-locking frequencies by high order resonance mode-locking.

It is also to be noted that the mode-locked laser can be naturally used for short pulse soliton transmission through the fiber. For this purpose the pulses ought to be designed with the intensity and duration required for soliton transmission.

The reflectivities of the selective mirrors can be within the ranges of tens of percent, and in the experiment conducted, this was about 60%. The selective mirror can be partially reflective and partially transmissive to allow for laser output from the gratings side. But it is also possible to obtain the output from the first end mirror (or another port of the cavity).

The frequency width tolerance of the mode-locked frequency and other parameters can be flexible. This can be designed.

Today, for the commonly used fiber optic transmission wavelength range around 1550 nanometers with erbium-doped amplifiers, there is available a bandwidth transmission of about 50 nanometers. This means that the Bragg wavelength of the selective mirrors can be scattered within this range. Currently, no final standards exist for the separation between the wavelengths for WDM but some groups use intervals of about 0.8 nanometers between wavelengths. This would allow about 60 wavelength channels. However, more dense spacing and broader bandwidths are expected in the future.

The physical location of the selective mirrors (gratings 20) in the fiber can be defined in discrete locations or continuous locations. Also the Bragg wavelength (periodicity of the grating) can be discrete or continuously distributed along the distance. This kind of grating is called a chirped grating. This can enable a continuous tuning of the laser wavelength by continuously varying the applied frequency.

In conclusion, the present invention provides in a preferred embodiment, an eight channel wavelength-selectable fiber and diode laser coupled to a series of fiber gratings, based on cavity resonance addressing. Higher channel number with denser wavelength spacing can be obtained, in this method. Such laser sources can be of use for high speed dynamic WDM fiber networks.

Having described the invention with regard to certain specific embodiments thereof, it is to be understood that the description is not meant as a limitation, since firther modifications may now suggest themselves to those skilled in the art, and it is intended to cover such modifications as fall within the scope of the appended claims.

What is claimed is:

1. A wavelength-selectable laser system comprising:
   a complex laser cavity defined by a reflective mirror at one end and at the other end, a series of spaced apart wavelength-selective mirrors each defining a respective predetermined cavity length, associated with a specific wavelength;
   a laser gain element; and
   an active modulation element in said complex laser cavity operable to selectively mode-lock said cavity with a mode-locking frequency matched to a specific cavity length among said defined predetermined cavity lengths, thereby providing said specific wavelength,
   said active modulation element being capable of switching from said specific wavelength to another specific wavelength by said selective mode-locking,
   said active modulation element switching being capable of providing a selectable wavelength channel in communications in a dynamic wavelength division multiplexing network, having multiple wavelength channels,
   such that each channel enables carrying of information which can be routed and processed independently.

2. The system of claim 1 wherein said wavelength-selective mirrors are provided by chirped fiber Bragg gratings.

3. The system of claim 1 wherein said laser gain element is provided by an erbium-doped fiber amplifier.

4. The system of claim 1 wherein said laser gain element is provided by a semiconductor laser amplifier.

5. The system of claim 1 wherein said mirror is a fiber loop mirror connected by a fiber coupler to said laser gain element.

6. The system of claim 1 wherein said wavelength-selective mirrors are provided by a plurality of fiber Bragg gratings.

7. The system of claim 1 wherein said channel is a fiber optic channel.

8. The system of claim 1 wherein said active modulation element is operated at basic mode-locking frequencies to provide a steady output pulse train at said basic mode-locked frequencies.

9. The system of claim 8 where in said steady output pulse train is provided in accordance with soliton transmission parameters of the fiber.

10. The system of claim 8 wherein said steady output pulse train comprises a quasi-continuous wave light source.

11. The system of claim 1 wherein said active modulation element has a high order mode-locking frequency producing high order mode-locked pulses.

12. The system of claim 1 further comprising a modulator for modulating input information.

13. The system of claim 12 further comprising a control element which matches a bit rate frequency of said active modulation element and said input information modulator.

14. The system of claim 13 wherein said bit rate frequency of said input information is significantly lower than said mode-locked frequency.

15. A method for wavelength selection in lasers comprising the steps of:
    providing a complex laser cavity defined by a reflective mirror at one end and at the other end, a series of spaced apart wavelength-selective mirrors each defining a respective predetermined cavity length, associated with a specific wavelength;
    providing an active modulation element in said complex laser cavity; and
    operating said active modulation element to selectively mode-lock said cavity with a mode-locking frequency matched to a specific cavity length among said defined predetermined cavity lengths, thereby providing said specific wavelength,
    said active modulation element being capable of switching from said specific wavelength to another specific wavelength by said selective mode-locking,
    said active modulation element switching being capable of providing a selectable wavelength channel in communications in a dynamic wavelength division multiplexing network, having multiple wavelength channels,
    such that each channel enables carrying of information which can be routed and processed independently.

16. The method of claim 15 wherein said active modulation element switching is performed in a fiber optic communications channel.

* * * * *